United States Patent
Lam et al.

(10) Patent No.: US 10,216,872 B2
(45) Date of Patent: *Feb. 26, 2019

(54) FLY-HEIGHT INTERACTION SIMULATION

(71) Applicant: International Business Machines Corporation, Armonk, NY (US)

(72) Inventors: Ho-Yiu Lam, Mountain View, CA (US); Jason Liang, Campbell, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/939,978

(22) Filed: Mar. 29, 2018

(65) Prior Publication Data

US 2018/0196903 A1 Jul. 12, 2018

Related U.S. Application Data

(63) Continuation of application No. 15/659,836, filed on Jul. 26, 2017, now Pat. No. 9,946,822, which is a continuation of application No. 15/099,933, filed on Apr. 15, 2016, now Pat. No. 10,055,521.

(51) Int. Cl.
*G06F 17/50* (2006.01)
*G06F 17/10* (2006.01)

(52) U.S. Cl.
CPC .......... *G06F 17/5009* (2013.01); *G06F 17/10* (2013.01)

(58) Field of Classification Search
CPC .... G06F 17/5009; G01Q 60/50; G01Q 60/52; G01Q 60/54; G01Q 60/56
USPC ........ 850/1, 2, 3, 4, 5, 7, 21, 22, 25, 35, 46, 850/47, 48, 49
See application file for complete search history.

(56) References Cited

U.S. PATENT DOCUMENTS

| | | |
|---|---|---|
| 5,266,897 A | 11/1993 | Watanuki et al. |
| 5,336,887 A | 8/1994 | Yagi et al. |
| 5,418,363 A | 5/1995 | Eilings et al. |
| 5,557,156 A * | 9/1996 | Elings ................ G01B 7/003 310/316.01 |

(Continued)

OTHER PUBLICATIONS

Lam et al., "Fly-Height Interaction Simulation", U.S. Appl. No. 15/594,347, filed Mar. 30, 2018, 27 pages.

(Continued)

*Primary Examiner* — Jason McCormack
(74) *Attorney, Agent, or Firm* — Christopher K. McLane

(57) ABSTRACT

In an approach for providing simulation results of an interaction between a transducer head and a magnetic medium, a computer identifies a first raster scan of a sample via a scanning probe microscope. The computer generates a topography image based on the first raster scan of the sample. The computer identifies one or more reference features within the created topography image. The computer calculates an average height based on the one or more reference features. The computer determines a lift distance associated with a probe of the scanning probe microscope. The computer defines a uniform plane based on the calculated average height and the determined lift distance. The computer performs a second raster scan of the sample based on the defined uniform plane. The computer generates a fly-height image based on the second raster scan. The computer provides simulation results based at least in part on the second raster scan.

1 Claim, 5 Drawing Sheets

(56) References Cited

U.S. PATENT DOCUMENTS

| | | | |
|---|---|---|---|
| 5,751,527 A | 5/1998 | Sundaram et al. | |
| 6,818,891 B1 | 11/2004 | Hough et al. | |
| 8,699,169 B2 | 4/2014 | Biskeborn | |
| 9,946,822 B2 * | 4/2018 | Lam | G06F 17/10 |
| 2002/0183963 A1 | 12/2002 | Kocimski | |
| 2008/0149822 A1 * | 6/2008 | Vertes | B82Y 20/00 |
| | | | 250/282 |
| 2014/0366228 A1 * | 12/2014 | Williams | G01Q 60/12 |
| | | | 850/4 |
| 2016/0116846 A1 | 4/2016 | Schellenberg et al. | |
| 2016/0258979 A1 | 9/2016 | Shi et al. | |
| 2017/0300603 A1 | 10/2017 | Lam et al. | |
| 2017/0316132 A1 | 11/2017 | Lam et al. | |

OTHER PUBLICATIONS

Lam et al., "Fly-Height Interaction Simulation", U.S. Appl. No. 16/044,658, filed Jul. 25, 2018, 33 pages.
Appendix P, list of patents and patent applications treated as related, filed herewith, 2 pages.

* cited by examiner

FLY-HEIGHT INTERACTION SIMULATION

BACKGROUND

The present invention relates generally to the field of atomic force microscopy, and more particularly to simulating an interaction of a magnetic recording medium and transducing heads at a constant fly-height.

Atomic-force microscopy (AFM) or scanning-force microscopy (SFM) is a very-high-resolution type of scanning probe microscopy (SPM), with demonstrated resolution on the order of fractions of a nanometer, more than 1000 times better than the optical diffraction limit. Scanning probe microscopy (SPM) forms images of surfaces at the atomic level using a physical probe that scans a sample. The AFM has three major abilities: force measurement, imaging, and manipulation. For imaging, an image of the topography (i.e., three-dimensional shape) of a sample surface at a high resolution forms, based on the reaction of the probe to the forces that the sample imposes on the probe. In manipulation, the forces between the probe and sample can also be used to change the properties of the sample in a controlled way (e.g., atomic manipulation, scanning probe lithography, local stimulation of cells, etc.). Simultaneous with the acquisition of topographical images, other properties (e.g., mechanical properties, electrical properties, etc.) of the sample can be measured locally and displayed as an image, often with similarly high resolution.

A read/write head (e.g., tape head) is a type of transducer used in conjunction with a magnetic medium for storage of information through the conversion of electrical signals to magnetic fluctuations and retrieval through an opposite conversion. The read/write head is separated from the magnetic medium by a distance known as a flying height (e.g., floating height, or head gap). The read/write head consists of a core of magnetic material arranged in a toroid and a narrow gap filled with a diametric material. When a magnetic flux is forced out through the narrow gap of the read write head into the magnetic medium, the magnetic flux magnetizes the magnetic medium.

SUMMARY

Aspects of the present invention disclose a method, computer program product, and system for providing simulation results of an interaction between a transducer head and a magnetic medium. The method comprises one or more computer processors identifying a first raster scan of a sample via a scanning probe microscope. The method further comprises one or more computer processors generating a topography image based on the first raster scan of the sample. The method further comprises one or more computer processors identifying one or more reference features within the created topography image. The method further comprises one or more computer processors calculating an average height based on the identified one or more reference features. The method further comprises one or more computer processors determining a lift distance associated with a probe of the scanning probe microscope. The method further comprises one or more computer processors defining a uniform plane based on the calculated average height and the determined lift distance. The method further comprises one or more computer processors performing a second raster scan of the sample based on the defined uniform plane. The method further comprises one or more computer processors generating a fly-height image based on the second raster scan. The method further comprises one or more computer processors providing simulation results based at least in part on the second raster scan.

DETAILED DESCRIPTION

Embodiments of the present invention recognize that mapping the magnetic, electrical, and thermal responses of read/write heads, in the presence of a magnetic medium (e.g., tape media) moving at a fly-height above the read/write heads, is desirable in order to simulate actual product operation. Embodiments of the present invention recognize the magnetic, electrical, and thermal responses can be obtained by lifting the probe a defined distance away from the surface, however the actual fly-height is not simulated and includes deficiencies. Deficiencies include: not following the exact topography of the read/write head, the actual fly-height does not vary with each line or topography data, setting the fly-height distance based on the median or average of the topography data, setting the fly-height based on the topography data of each scan line in the raster scan, and differences in magnetic amplitude of a sensor may not be identified. Embodiments of the present invention identify a reference feature(s) in a 3D topography map, set a constant fly-height (i.e., sets an actual fly-height based on certain reference features, such as the summits and plateaus, within the 3D topography), and simulate the interaction of the read/write head with the magnetic medium (e.g., sample), thus providing an indication of actual product operation.

Figure 1:
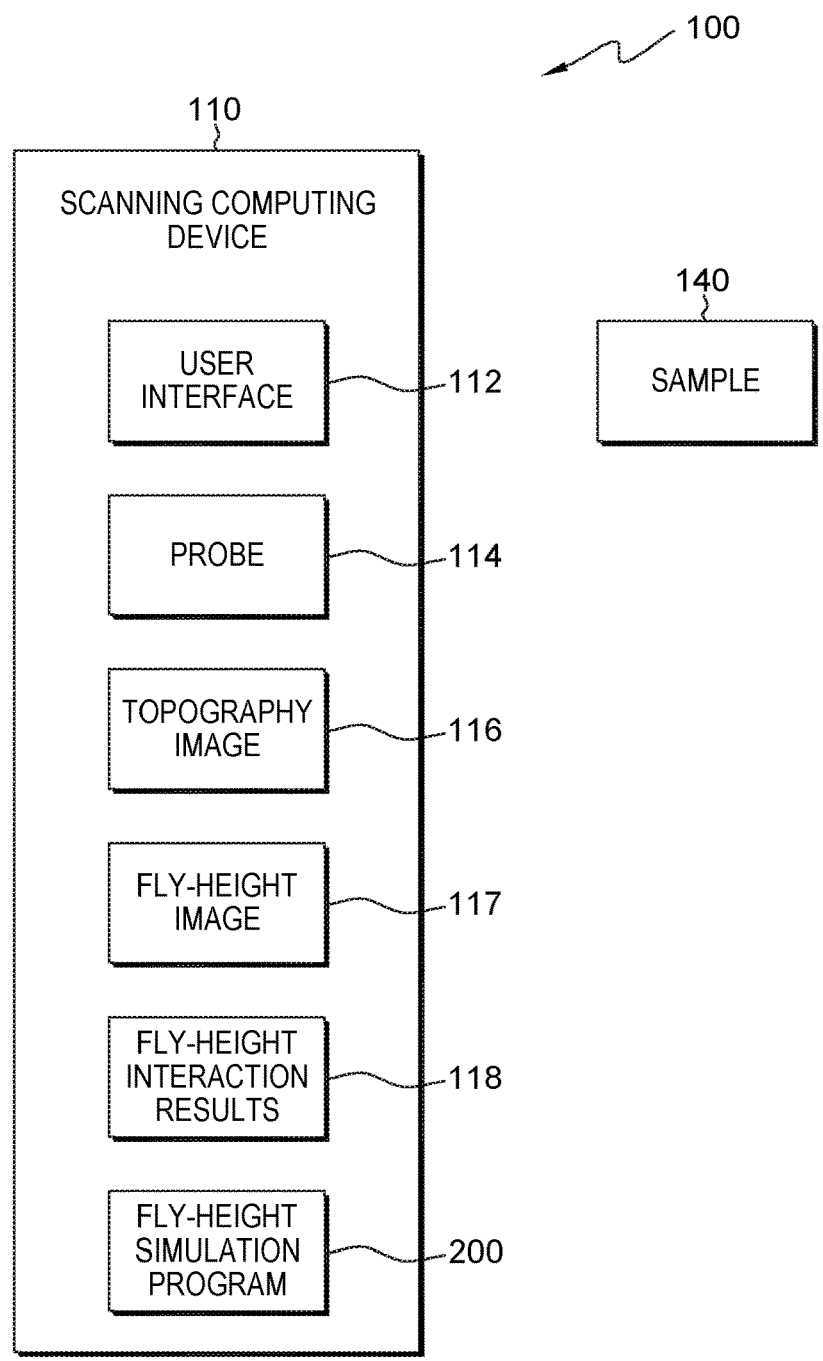
FIG. 1 is a functional block diagram illustrating an atomic force microscopy environment, in accordance with an embodiment of the present invention.

The present invention will now be described in detail with reference to the Figures. FIG. 1 is a functional block diagram illustrating an atomic force microscopy environment, generally designated 100, in accordance with one embodiment of the present invention. FIG. 1 provides only an illustration of one embodiment and does not imply any limitations with regard to the environments in which different embodiments may be implemented.

In the depicted embodiment, atomic force microscopy environment 100 includes scanning computing device 110 and sample 140. Atomic force microscopy environment 100 may include additional computing devices, mobile computing devices, servers, computers, storage devices, or other devices not shown.

Scanning computing device 110 may be any electronic device or computing system capable of processing program instructions and receiving and sending data. In the depicted embodiment, scanning computing device 110 represents a workstation that includes probe 114 and the associated software programs that operate probe 114 and collect data associated with scans. A workstation is a special computer designed for technical or scientific applications, intended primarily to be used by one user at a time, running multi-user operating systems that that manage computer hardware (e.g. probe 114) and software resources and provides common services for computer programs. In some embodiments, scanning computing device 110 may be a laptop computer, a tablet computer, a netbook computer, a personal computer (PC), a desktop computer, a personal digital assistant (PDA), a smart phone, or any programmable electronic device that includes probe 114 (e.g., self-contained computing device that includes an instance of probe 114 that is embedded or a peripheral, computing device directly connected to an atomic force microscope, etc.). In other embodiments, scanning computing device 110 may represent a server computing system utilizing multiple computers as a server system, such as in a cloud computing environment that connects separately to probe 114. For example, a computing device connects over a network (not shown) to a separate atomic force microscope that includes probe 114. In general, scanning computing device 110 is representative of any electronic device or combination of electronic devices capable of executing machine readable program instructions as described in greater detail with regard to FIG. 5, in accordance with embodiments of the present invention. Scanning computing device 110 contains user interface 112, probe 114, topography image 116, fly-height image 117, fly-height interaction results 118, and fly-height simulation program 200 as depicted and described in further detail with respect to FIG. 5.

User interface 112 is a program that provides an interface between a user and scanning computing device 110, and a plurality of applications that reside on scanning computing device 110. Additionally, in some embodiments, user interface 112 provides an interface between a user of scanning computing device 110 and a plurality of applications that reside and/or may be accessed over a network connected to a server or computing device (not shown). A user interface, such as user interface 112 refers to the information (e.g., graphic, text, sound) that a program presents to a user and the control sequences the user employs to control the program. A variety of types of user interfaces exist. In one embodiment, user interface 112 is a graphical user interfaces. A graphical user interface (GUI) is a type of interface that allows users to interact with peripheral devices (i.e., external computer hardware that provides input and output for a computing device, such as a keyboard and mouse) through graphical icons and visual indicators as opposed to text-based interfaces, typed command labels, or text navigation. The actions in GUIs are often performed through direct manipulation of the graphical elements. User interface 112 sends and receives information through fly-height simulation program 200 to initiate scans of sample 140 via probe 114.

Probe 114 is a scanning probe associated with a scanning probe microscope (e.g., atomic force microscope). Probe 114 scans sample 140, which provides raw data that fly-height simulation program 200 utilizes to create topography image 116, fly-height image 117, and fly-height interaction results 118. In the depicted embodiment, probe 114 is included as part of scanning computing device 110. In another embodiment, probe 114 may be separate from scanning computing device 110, provided probe 114 is accessible to scanning computing device 110 such as over a network (not shown). Probe 114 provides the raw data to fly-height simulation program 200 to create topography image 116, fly-height image 117, and fly-height interaction results 118.

Topography image 116 is an image of the shape and features of the surface of sample 140 that results from the raster scan of sample 140 by probe 114. When using probe 114 of scanning computing device 110 (e.g., integrated computing system and AFM) to image sample 140, the tip of probe 114 is brought into contact and/or close proximity (e.g., nanometers, proximity is measured on an atomic scale) with sample 140, and sample 140 is raster scanned along an x-y grid. At discrete points in the raster scan, fly-height simulation program 200 records values corresponding to the position of sample 140 with respect to the tip of probe 114, and records the height of probe 114 that corresponds to a constant interaction of probe 114 with sample 140 (e.g., topographic imaging in AFM). The surface topography of sample 140, depicted and stored in topography image 116, is commonly displayed as a pseudo color plot, derived from a grayscale image that maps each intensity value (e.g., readings from probe 114) to a color according to a table or function. The intensity or brightness, is measured on a scale form black (i.e., zero intensity) to white (i.e., full intensity). In the depicted embodiment, topography image 116 resides on scanning computing device 110. In another embodiment, topography image 116 may reside on a server, or another computing device connected over a network (not shown) provided topography image 116 is accessible by fly-height simulation program 200.

Fly-height image 117 is a three dimensional image of sample 140. Fly-height simulation program 200 creates fly-height image 117 through a second scan of sample 140 via probe 114 with a set fly-height plane (i.e., constant fly-height that does not vary with the surface topography of sample 140). For example a reference height is set by a user and/or fly-height simulation program 200 based on topography image 116. The set reference maintains probe 114 at a fixed fly-height that does not allow probe 114 to follow the contours of sample 140 as identified in topography image 116, and therefore, the actual distance between probe 114 and sample 140 is able to change, rather than maintaining a variable fly-height which maintains a specified distance between probe 114 and sample 140 (i.e., the actual distance between probe 114 and sample 140 does not change as probe 114 follows the actual contours of sample 140). In the depicted embodiment, fly-height image 117 resides on scanning computing device 110. In another embodiment, fly-height image 117 may reside on another computing device or server connected over a network (not shown), provided fly-height image 117 is accessible by fly-height simulation program 200.

Fly-height interaction results 118 include the magnetic measurements, electrical measurements, and/or thermal measurements associated with sample 140 gathered with respect to fly-height image 117. Fly-height simulation program 200 analyzes fly-height image 117 to provide fly-height interaction results 118. In some embodiments, fly-height interaction results may include a comparison between the readings associated with topography image 116 and fly-height image 117. In the depicted embodiment, fly-height interaction results 118 reside on scanning computing device 110. In another embodiment, fly-height interaction results 118 may reside on another computing device or server connected over a network (not shown), that is accessible by fly-height simulation program 200.

Sample 140 is a medium for magnetic recording that stores data on a magnetized medium, utilizing different patterns of magnetization in a magnetisable material. The information stored in sample 140 can be accessed through one or more read/write heads. In an exemplary embodiment, sample 140 is a magnetic tape, which is a magnetic medium made of a thin magnetizable coating on a long, narrow strip of plastic film. In another embodiment, sample 140 may be another medium for magnetic recording (e.g., hard disk platters, floppy disks, magnetic strips, etc.). In the depicted embodiment, fly-height simulation program 200 scans sample 140 via probe 114, which provides the data (e.g., probe 114 readings) that creates topography image 116, fly-height image 117, and fly-height interaction results 118. In another embodiment, another software program (not shown) associated with the AFM, scans sample 140 via probe 114, stores the results for use by fly-height simulation program 200 and/or creates topography image 116 and fly-height image 117.

Fly-height simulation program 200 is a program for simulating the read/write head (e.g., probe 114, tape head) to magnetic tape (e.g., sample 140) interaction. Fly-height simulation program 200 identifies inconsistencies (e.g., increases and decreases in resistance) associated with the actual surface of sample 140 that corresponds to data loss associated with compromised sensors and/or scratches in the magnetic medium of sample 140. In an exemplary embodiment, fly-height simulation program 200 includes the capability to initiate scans of sample 140 via probe 114 to create topography image 116 and fly-height image 117. In another embodiment, fly-height simulation program 200 is a separate program that analyzes topography image 116, provides a reference fly-height to a separate program, and initiates the scan of sample 140 with the reference fly-height (e.g., actual fly-height) to create fly-height image 117. Additionally fly-height simulation program 200 provides fly-height interaction results 118 depicting and/or providing the magnetic measurements, electrical measurements, and/or thermal measurements associated with sample 140. In the depicted embodiment, fly-height simulation program 200 resides on scanning computing device 110. In another embodiment, fly-height simulation program 200 may reside on a server, or another computer device connected over a network provided, fly-height simulation program 200 has access to probe 114, topography image 116, and fly-height image 117.

Figure 2:
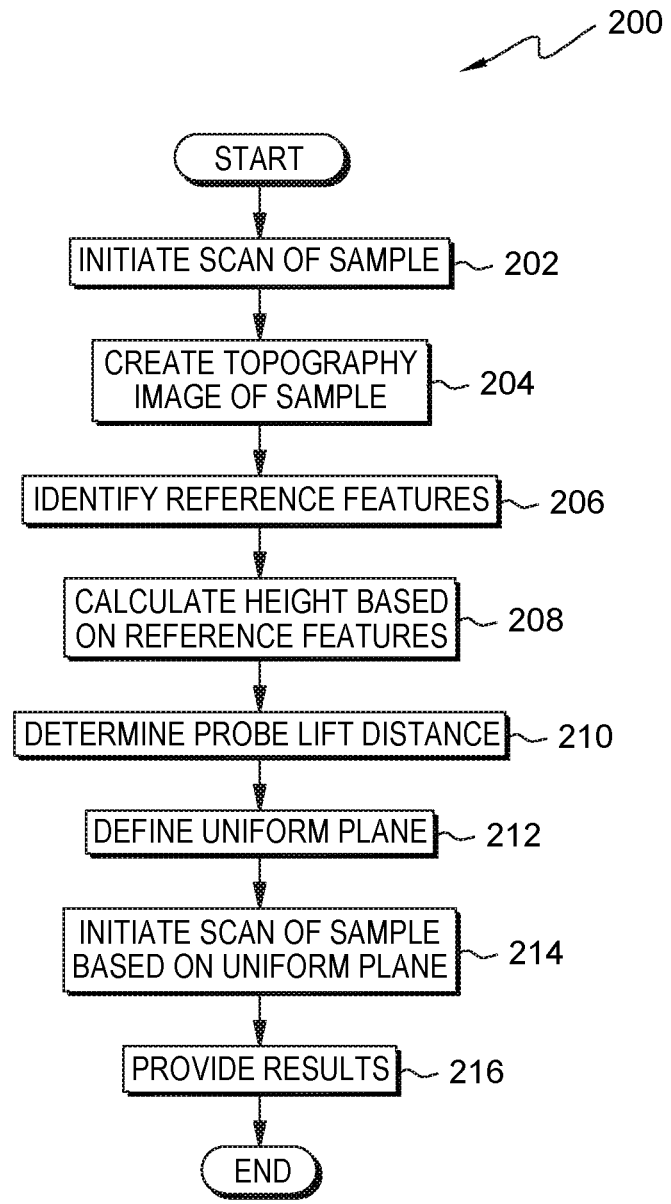
FIG. 2 is a flowchart depicting operational steps of a fly-height simulation program, on a computing device within the atomic force microscopy environment of FIG. 1, for simulating the interaction between a read/write head and a magnetic medium based on a reference fly-height in accordance with an embodiment of the present invention.

FIG. 2 is a flowchart depicting operational steps of a fly-height simulation program 200, a program for simulating the interaction between a read/write head and a magnetic medium based on a reference fly-height in accordance with an embodiment of the present invention. Prior to initiating, sample 140 is places in a designated position associated with probe 114 of scanning computing device 110. For example sample 140 is placed on a stage (e.g., platform surface) that is attached to a xyz drive which moves the stage that includes sample 140. The tip of probe 114 is above sample 140, connected to a cantilever with a piezoelectric element that oscillates the cantilever. The detector of AFM measures the deflection (i.e., displacement with respect to the equilibrium position) of the cantilever and converts the deflection into an electrical signal in which the intensity of the electrical signal is proportional to the displacement of the cantilever.

In step 202, fly-height simulation program 200 initiates a scan of sample 140. In one embodiment, fly-height simulation program 200 initiates in response to a user action after placing sample 140 in a designated position associated with probe 114 from which a scan occurs (e.g., first raster scan). In another embodiment, fly-height simulation program 200 initiates in response to automatically detecting the presence of sample 140 placed in the designated position associated with probe 114. Upon initiation, fly-height simulation program 200 instructs probe 114 to raster scan sample 140. The raster scan, or raster scanning, is the rectangular pattern of image capture and reconstruction. In a raster scan, sample 140 is subdivided into a sequence of horizontal strips known as scan lines. Each scan line transmits an analog signal to scanning computing device 110 as probe 114 records data from sample 140. In some embodiments, the analog signal may be further divided into discrete pixels, in which the ordering of the pixels are by rows known as raster order, for further processing by scanning computing device 110. In raster scanning, the beam associated with probe 114 sweeps horizontally left-to-right at a slight vertical angle, then sweeps back to the left at a slight vertical angle, and then sweeps out to record the next scan line. Fly-height simulation program 200 records the deflection of probe 114 as height data as probe 114 makes contact and/or close proximity (e.g., nanometers, proximity is measured on an atomic scale) with the surface of sample 140.

In step 204, fly-height simulation program 200 creates a topography of a sample (e.g., generates topography image 116). After completion of the raster scanning, fly-height simulation program 200 utilizes the raster scans (i.e., individual line scans of sample 140) to represent the surface topography of sample 140 as topography image 116 (i.e. fly-height simulation program 200 combines all of the height data associated with each scan line to form topography image 116) as a pseudo color image. For example, fly-height simulation program 200 recombines the raster scans as a grayscale image. Fly-height simulation program 200 maps an intensity value associated with each data point of the individual raster scans to a color according to a table or function, thereby creating topography image 116. Within topography image 116, fly-height simulation program 200 depicts data points with a lower height (e.g., valleys, troughs, etc.) with a darker color (e.g., lower intensity, black), and depicts data points with a higher height (i.e., peaks, plateaus, etc.) and a lighter color (e.g., higher intensity, white) within the grayscale image. Additionally areas associated with a darker color within topography image 116 represent areas in which the overall fly-height is higher, and areas associated with a lighter color represent areas in which the overall fly-height is lower. For example fly-height simulation program 200 determines probe 114 maintains a fly-height of 20 nanometers when sample 140 is consistent and thus depicts a dark gray to black color, but fly-height simulation program 200 determines probe 114 drops to an overall fly-height of 10 nanometer when a scratch (e.g., pit, divot, etc.) is present in sample 140 and thus depicts a light gray or white color within topography image 116.

In step 206, fly-height simulation program 200 identifies reference features within topography image 116. In one embodiment, fly-height simulation program 200 identifies one of more references within topography image 116 based on receiving selections from a user viewing topography image 116 via user interface 112. In another embodiment, fly-height simulation program 200 selects reference features within topography image 116 based on predefined characteristics. Fly-height simulation program 200 receives features from a user and/or automatically through selections made by fly-height simulation program 200 that identify areas within topography image 116 that include high contrasts. Fly-height simulation program 200 draws one or more rectangles around black areas within topography image 116 that correspond to maximum fly-height distances, and one or more rectangles around white areas within topography image 116 that indicates minimum fly-height distances within topography image 116. In one embodiment, the size of the rectangles are selectable by the user and/or fly-height simulation program 200 based on predefined settings. For example, fly-height simulation program 200 selects data points within topography image 116 that surround the highest and lowest intensity grayscale values by a specified distance, grayscale value variation, and or percentage of the maximum and/or minimum grayscale value. In another embodiment, the rectangles are fixed sizes based on the predefined settings within fly-height simulation program 200. For example the rectangle may include one or more sizes to encompass varying degrees of area within topography image 116 (e.g., small, medium, large, set number of pixels, etc.)

In step 208, fly-height simulation program 200 calculates a height based on the selected reference features. Fly-height simulation program 200 retrieves the height values associates with the individual data points within the identified reference features of topography image 116. For example, fly-height simulation program 200 extracts the corresponding data values (e.g., heights) of the areas within the identified rectangles, thereby identifying maximum and minimum distances between probe 114 and sample 140 represented within topography image 116. In one embodiment, fly-height simulation program 200 identifies the maximum height within the identified rectangles and sets the height to the maximum height value (e.g., peak reference feature height). In another embodiment, fly-height simulation program 200 calculates an average (e.g. mean) value of the height associated with the identified reference features. In yet some other embodiment, fly-height simulation program identifies a median value within the reference sets for the height. Fly-height simulation program 200 organizes the heights associated with the reference sets from highest to lowest. Fly-height simulation program 200 identifies the middle height value within the data set of heights as the height.

In step 210, fly-height simulation program 200 determines a lift distance associated with probe 114. The lift distance is an additional offset (i.e., value) above the identified reference features that simulates sample 140 (e.g., tape media) flying over the read/write head. In one embodiment, fly-height simulation program 200 receives a lift distance from the user of scanning computing device 110 via user interface 112. In another embodiment, fly-height simulation program 200 determines a lift distance based on the type of medium associated with sample 140. For example, the lift distance associate with magnetic tape medium may be a different lift distance than the lift distance associated with a hard drive. In some other embodiment, fly-height simulation program 200 utilizes a preset lift distance (e.g., standard lift distance) that is not dependent on sample 140. In yet another embodiment, fly-height simulation program 200 determines a lift distance based on the peak height within the reference features and/or the calculated average height (i.e., sets the lift distance so the combination of the calculated height and the lift distance are greater than the peak reference height).

In step 212, fly-height simulation program 200 defines a uniform plane. Fly-height simulation program 200 calculates a lift distance for each data point within topography image 116. The uniform plane allows variations in the overall height distance between probe 114 and sample 140 to maintain a set actual fly-height (i.e., position of probe 114 is fixed) above sample 140 rather than varying the position of probe 114 and following the contours of sample 140 to maintain a set separation distance (i.e., position of probe 114 varies). For example, in an instance that fly-height simulation program 200 defines the uniform plane, the actual fly-height is set at 3 nanometers, but the distance between probe 114 and sample 140 varies between 3 and 4 nanometers across sample 140, the increased distances indicate scratches or pits in the surface of sample 140 (e.g., tape medium). Conversely, in an instance that fly-height simulation program 200 does not include the uniform plane, but utilizes a fixed separation distance, the fly-height remains constant at 3 nanometers and probe 114 moves closer to sample 140 upon encountering a scratch or pit in the surface of sample 140 to maintain a constant fly-height separation of 3 nanometers.

Figure 3:
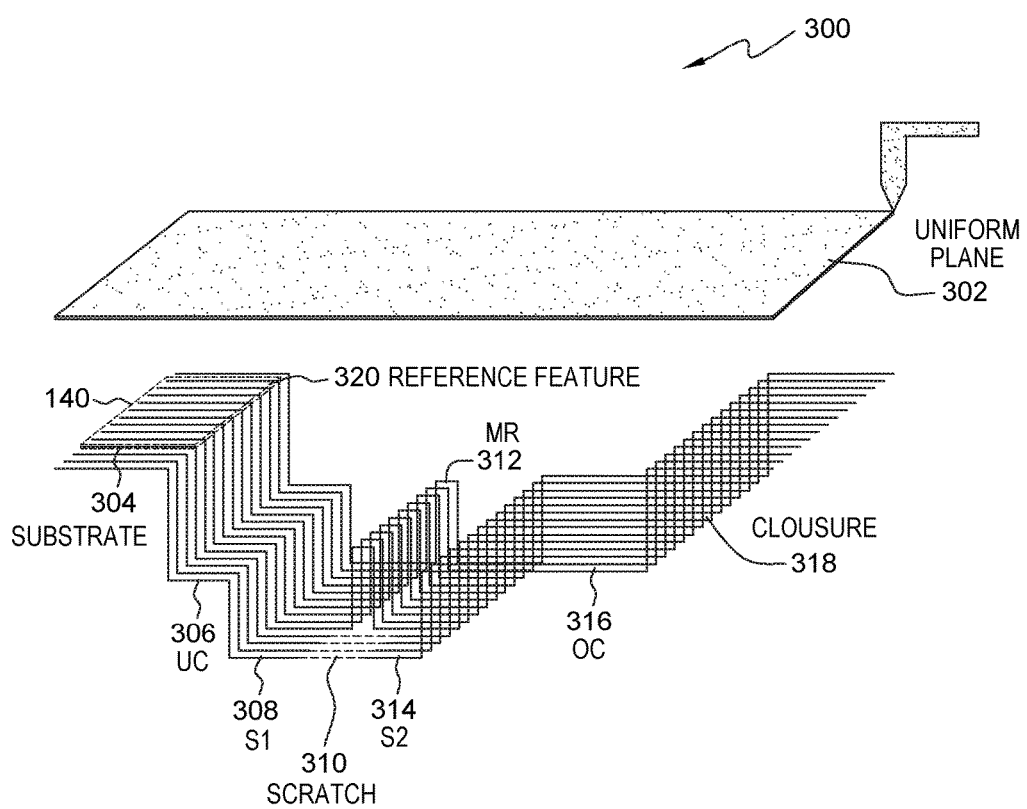
FIG. 3 depicts an example of a path traversed by a probe that maintains a constant reference fly-height over a topography of a sample that includes a scratch in accordance with an embodiment of the present invention.

In step 214, fly-height simulation program 200 initiates a scan of sample 140 based on the defined uniform plane (step 212). Fly-height simulation program 200 utilizes the uniform plane with the calculated data values to provide the scan profile that guides probe 114 over sample 140 (i.e., probe 114 maintains a fixed position by setting an actual fly-height) for the raster scan (e.g., second raster scan). As depicted in FIG. 3, fly-height simulation image 300 (e.g., fly-height image 117), the path of probe 114 follows uniform plane 302 (i.e., fixed actual fly-height in which the actual distance varies) above sample 140. Sample 140 includes wafer or wafer substrate (e.g., substrate 304), undercoat layer (e.g., UC 306), shield 1 layer (e.g., S1 308), scratch 310, magnetoresistive sensor (e.g., MR 312), shield 2 layer (e.g., S2 314), overcoat layer (OC 316), and wafer or wafer substrate closure (e.g., closure 318). Substrate 304 and closure 318 are at the same height level within sample 140, which additionally corresponds to reference features (e.g., reference feature 320) identifying the peak height within sample 140. UC 306 and OC 316 are at the same height level within sample 140. S1 308, scratch 310, and S2 314 are the same height level within sample 140. However, the area encompassed by scratch 310 should be at the same height level as MR 312 within sample 140. As fly-height simulation program 200 raster scans sample 140, with the fixed fly-height in the uniform plane, the scan lines combine to create the three dimensional representation of sample 140 as fly-height simulation image 300. Fly-height simulation program 200 measures forces (e.g., magnetic, electrical, thermal, etc.) received by probe 114, thereby simulating the interactions of a read/write head with sample 140. Fly-height simulation program 200 records the forces, (e.g., increases and decreases) in the amplitude. Fly-height simulation program 200 identifies decreases in the amplitude as signal loss (e.g., data loss) which corresponds with scratch 310.

Figure 4:
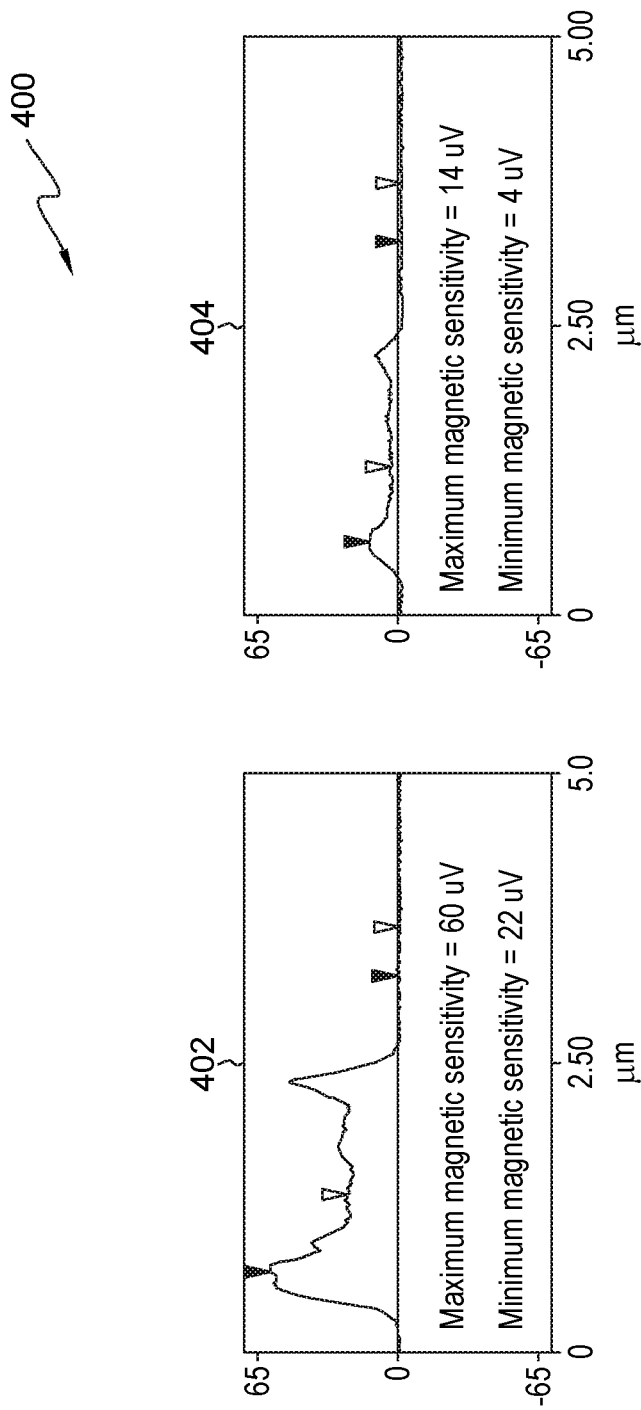
FIG. 4 depicts examples of magnetic sensitivity readings of the sample with and without incorporating the fly-height simulation program in accordance with an embodiment of the present invention.

Fly-height simulation program 200 additionally creates fly-height interaction results 118 based on the received forces from the scan of sample 140. In one embodiment, fly-height simulation program 200 creates a graph of the forces recorded by probe 114 as depicted in FIG. 4, fly-height interaction results comparison 400. Fly-height interaction results 402 depict the forces measured by probe 114 with respect to sample 140 in an instance in which the fly-height distance is constant (i.e., allows probe 114 to raise and lower, following the contours of sample 140). Fly-height interaction results 404 depicts the forces measure by probe 114 that would actually occur between the read/write head and sample 140 (i.e., probe 114 maintains a fixed position in which the actual distance between probe 114 and sample 140 varies, thus simulating an actual interaction of the read/write head and sample 140). In another embodiment, fly-height simulation program 200 creates a file that includes the data points and recorded force values (e.g., raw data) for viewing and/or graphing.

In step 216, fly-height simulation program 200 provides results (e.g., topography image 116 and fly-height interaction results 118) to the user. In one embodiment, fly-height simulation program 200 provides results to the user from which the user interprets and identifies areas within sample 140 that result in failures. In another embodiment, fly-height simulation program 200 analyzes topography image 116 and fly-height interaction results 118, and identifies areas within topography image 116 and fly-height interaction results 118 that result in failures. For example, fly-height simulation program 200 highlights or circles areas of high contrast in the greyscale pseudo color of topography image 116, and compares changes in sensitivity readings in fly-height interaction results 118 (e.g., large variations indicate a failure). Based on analysis of the provided results by fly-height simulation program 200 and/or the user, the user can then fix the source of the failure.

For example, in a visual side by side comparison of fly-height interaction results 402 and fly-height interaction results 404 as depicted in FIG. 4, fly-height interaction results 402 indicate higher readings (e.g., increased sensitivity readings) than fly-height interaction results 404 (e.g., decrease sensitivity readings) associated with sample 140. The difference between fly-height interaction results 402 and fly-height interaction results 404 can be attributed to path loss (e.g., data loss, signal loss, etc.). Path loss or path attenuation, is the reduction in power density (i.e., attenuation) of an electromagnetic wave as the wave propagates through space. For example, the greater the distance over which the signal travels the lower the amplitude of the signal received at probe 114, as depicted by fly-height interaction results 402, and the converse in fly-height interaction results 402. The sensitivity readings in fly-height interaction results 404 indicate a compromise in the magnetoresistive sensor (e.g., MR 312) due to scratch 310, which the sensitivity readings in fly-height interaction results 402 mask. The user can then replace the scratched magnetoresistive sensor (e.g., MR 312) to prevent subsequent errors.

Figure 5:
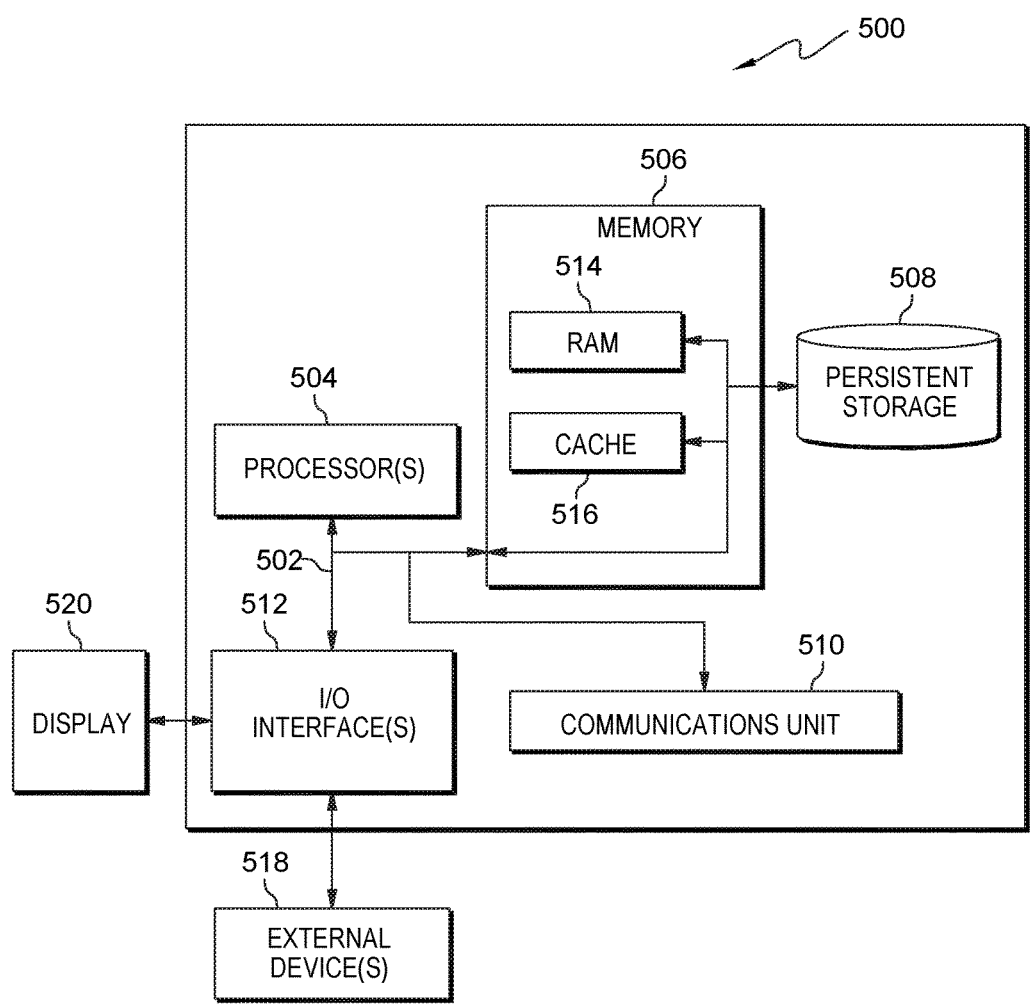
FIG. 5 is a block diagram of components of the scanning computing device executing the fly-height simulation program, in accordance with an embodiment of the present invention.

FIG. 5 depicts a block diagram of components of scanning computing device 500 in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Scanning computing device 500 includes communications fabric 502, which provides communications between cache 516, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses or a crossbar switch.

Memory 506 and persistent storage 508 are computer readable storage media. In this embodiment, memory 506 includes random access memory (RAM) 514. In general, memory 506 can include any suitable volatile or non-volatile computer readable storage media. Cache 516 is a fast memory that enhances the performance of computer processor(s) 504 by holding recently accessed data, and data near accessed data, from memory 506.

User interface 112, topography image 116, fly-height simulation image 117, fly-height interaction results 118, and fly-height simulation program 200 may be stored in persistent storage 508 and in memory 506 for execution and/or access by one or more of the respective computer processor(s) 504 via cache 516. In an embodiment, persistent storage 508 includes a magnetic hard disk drive. Alternatively, or in addition to a magnetic hard disk drive, persistent storage 508 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. User interface 112, topography image 116, fly-height simulation image 117, fly-height interaction results 118, and fly-height simulation program 200 may be downloaded to persistent storage 508 through communications unit 510.

I/O interface(s) 512 allows for input and output of data with other devices that may be connected to scanning computing device 500. For example, I/O interface(s) 512 may provide a connection to external device(s) 518, such as a keyboard, a keypad, a touch screen, and/or some other suitable input device. External devices 518 can also include portable computer readable storage media such as, for example, thumb drives, portable optical or magnetic disks, and memory cards. Software and data used to practice embodiments of the present invention, e.g., User interface 112, topography image 116, fly-height simulation image 117, fly-height interaction results 118, and fly-height simulation program 200, can be stored on such portable computer readable storage media and can be loaded onto persistent storage 508 via I/O interface(s) 512. I/O interface(s) 512 also connect to a display 520.

Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer program product for providing simulation results of an interaction between a transducer head and a magnetic medium the computer program product comprising:

one or more non-transitory computer readable storage media and program instructions stored on the one or more computer readable storage media, the program instructions comprising:

program instructions to identify a first raster scan of a sample via a scanning probe microscope, wherein the sample is a magnetic medium;

program instructions to generate a topography image based on the first raster scan of the sample, wherein the topography image based on the first raster scan is a pseudo color image representing a surface topography of the sample based on a measurement of intensity values of received forces between the probe of the scanning probe microscope and the sample;

program instructions to identify one or more a high intensity values that corresponds to low heights within the created topography image based on the first raster scan;

program instructions to identify one or more low intensity values that corresponds to high heights within the created topography image based on the first raster scan;

program instructions to select one or more identified high intensity values within the topography image based on the first raster scan;

program instructions to select one or more identified low intensity values within the topography image based on the first raster scan;

program instructions to identify two or more reference features within the created topography image based on the selected one or more identified high intensity values and the selected one or more identified low intensity values;

program instructions to display the generated topography image to a user;

program instructions to receive one or more selections of the identified two or more reference features within the generated topography image from the user, wherein the one or more selections includes one or more rectangles placed by the user, around the identified two or more reference features;

program instructions to calculate an average height based on the received one or more selections of the identified two or more reference features;

program instructions to determine a lift distance associated with a probe of the scanning probe microscope wherein the lift distance is an additional offset above the identified two or more reference features that simulates the sample flying over a transducer head;

program instructions to calculate an actual fly-height wherein the actual fly-height combines the calculated average height and the determined lift distance;

program instructions to calculate a lift distance for each data point within the topography image based on the first raster scan of the sample based on the calculated actual fly-height, wherein the lift distance for each data point identifies a difference between the height of each data point and the actual fly-height to maintain the uniform plane;

program instructions to define a uniform plane based on the calculated average height and the determined lift distance;

program instructions to perform a second raster scan of the sample based on the defined uniform plane;

program instructions to generate a fly-height image based on the second raster scan;

program instructions to provide simulation results based at least in part on the second raster scan;

program instructions to display the topography image and the fly-height image; and program instructions to identify one or more failures based on a comparison of sensitivity values of the topography image and the fly-height image to identify variations.

* * * * *